United States Patent
Moriya

(10) Patent No.: US 7,586,965 B2
(45) Date of Patent: Sep. 8, 2009

(54) LASER DRIVE DEVICE AND IMAGE FORMING APPARATUS INCORPORATING THE SAME

(75) Inventor: Masaaki Moriya, Moriya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 11/862,383

(22) Filed: Sep. 27, 2007

(65) Prior Publication Data
US 2008/0013578 A1 Jan. 17, 2008

Related U.S. Application Data

(63) Continuation of application No. 11/250,126, filed on Oct. 13, 2005, now Pat. No. 7,308,010.

(30) Foreign Application Priority Data
Oct. 13, 2004 (JP) ............................. 2004-299073

(51) Int. Cl.
*H01S 3/00* (2006.01)
(52) U.S. Cl. ................ 372/38.02; 372/38.1; 372/38.01; 372/38.03; 372/38.07
(58) Field of Classification Search ............. 372/38.02, 372/38.1, 38.01, 38.03, 38.07
See application file for complete search history.

(56) References Cited

U.S. PATENT DOCUMENTS

| | | | |
|---|---|---|---|
| 5,373,518 A | 12/1994 | Uchiyama et al. | |
| 5,956,357 A * | 9/1999 | Joo | 372/38.02 |
| 6,246,659 B1 | 6/2001 | Suzuki et al. | |
| 6,586,771 B2 | 7/2003 | Suzuki | |
| 6,724,793 B2 | 4/2004 | Nagara | |
| 2005/0089069 A1 | 4/2005 | Ozasa et al. | |

FOREIGN PATENT DOCUMENTS

JP          3332916 B2       7/2002

* cited by examiner

*Primary Examiner*—Minsun Harvey
*Assistant Examiner*—Yuanda Zhang
(74) *Attorney, Agent, or Firm*—Rossi, Kimms & McDowell, LLP

(57) ABSTRACT

An inexpensive laser drive device which is capable of driving a laser for emission of an appropriate amount of light. Electric currents supplied from a supply current control device formed in an integrated circuit to a plurality of predetermined ports of the integrated circuit are turned on and off by switching devices in response to a signal from a signal output device of the supply current control device, and the on currents are supplied, as a driving current, from the supply current control device to a laser beam-emitting device through corresponding ones of the predetermined ports and resistors externally attached to these ports. A generator device formed in the integrated circuit generates a pulse signal for turning on and off a laser beam based on image data.

5 Claims, 8 Drawing Sheets

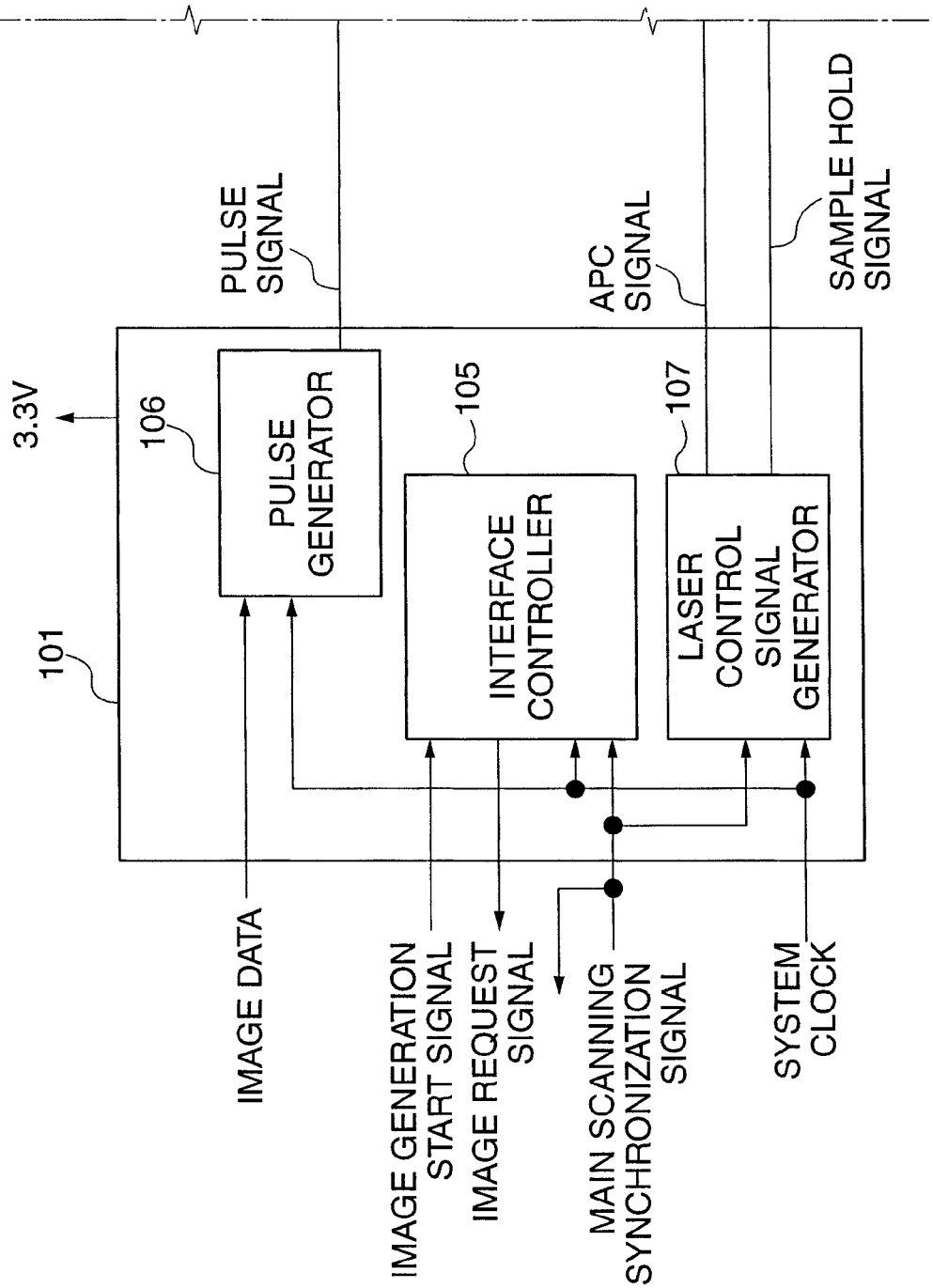

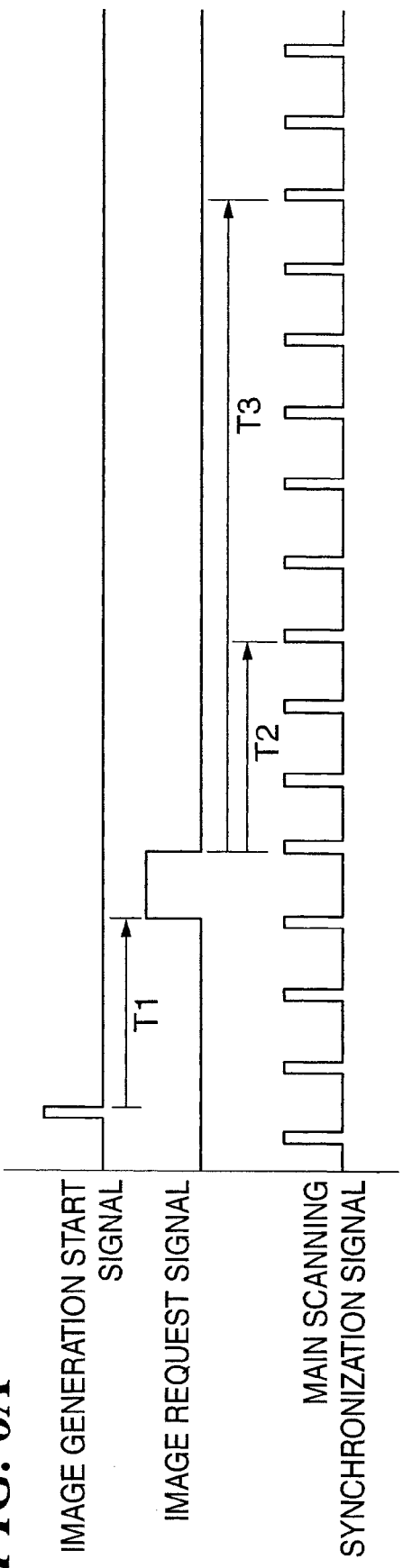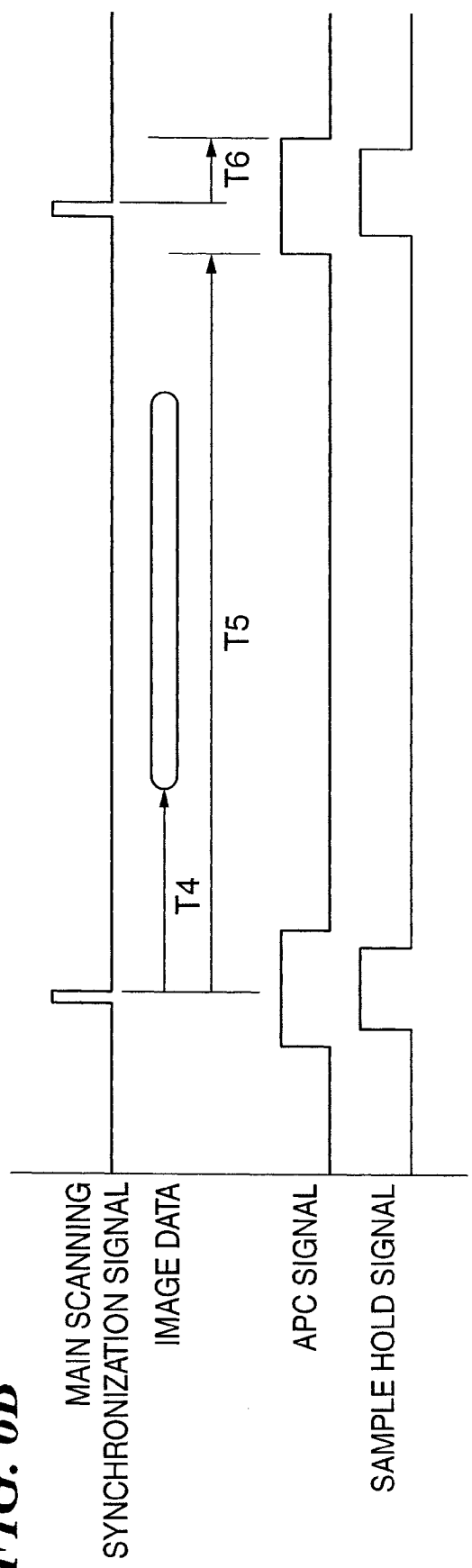

LASER DRIVE DEVICE AND IMAGE FORMING APPARATUS INCORPORATING THE SAME

This is a continuation of U.S. patent application Ser. No. 11/250,126.

BACKGROUND OF THE INVENTION

1. Field of the Invention

The present invention relates to a laser drive device and an image forming apparatus incorporating the same, and more particularly to a laser drive device for use in an image forming apparatus that forms an image by scanning a laser beam modulated by image data on a photosensitive member, and an image forming apparatus incorporating the same.

2. Description of the Related Art

A laser drive device employed in an image forming apparatus, such as a copying machine, a printer, or the like, is known e.g. from Japanese Patent No. 3332916. FIGS. 4A and 4B show the arrangement of a laser drive device of this type. In FIGS. 4A and 4B, reference numeral 101 designates an image processor LSI, 102 a laser driver IC, 103 a 5V output regulator, and 104 a semiconductor laser section that is comprised of a laser diode LD and a photo diode PD for detecting the amount of light emitted from the laser diode LD. A pulse signal generated based on image data by the image processor LSI 101, and so forth are input to the laser driver IC 102.

The image processor LSI 101 is comprised of an interface controller 105, a pulse generator 106, and a laser control signal generator 107. The interface controller 105 operates in response to an image generation start signal input from an external device, to return an image request signal to the external device in predetermined timing determined by counting pulses of a main scanning synchronization signal. The pulse generator 106 operates in response to the image request signal, to generate a PWM signal (pulse width modulation signal) based on image data sent from the external device, and output the PWM signal to the laser driver IC 102. The laser control signal generator 107 counts pulses of a system clock with reference to the main scanning synchronization signal, thereby generating an APC signal for specifying a light amount control period over which is controlled the amount of light emitted from the laser diode LD, and a sample hold signal for specifying a time period over which is formed a feedback loop for the light amount control, and delivers the APC signal and the sample hold signal to the laser driver IC 102.

The laser driver IC 102 is comprised of an OR gate 108, a driving current ON/OFF control circuit 109, a driving current source 110, a reference voltage source 111, a comparator 112, and a sample hold control circuit 113, and has a current/voltage converting variable resistor 114 and a holding capacitor 115 that are externally attached thereto.

The OR gate 108 outputs the logical sum of the PWM signal from the pulse generator 106 and the APC signal from the laser control signal generator 107 to the driving current ON/OFF control circuit 109. The driving current ON/OFF control circuit 109 is turned on when the output signal from the OR gate 108 goes high, and turned off when the output signal goes low. Further, when the driving current ON/OFF control circuit 109 is on, the laser diode LD of the semiconductor laser section 104 is lighted by power supplied from the driving current source 110, and when the circuit 109 is off, the laser diode LD is extinguished.

The sample hold control circuit 113 is turned on when the sample hold signal from the laser control signal generator 107 goes high. When the sample hold control circuit 113 is on, the feedback loop for the light amount control is formed, and the amount of current flowing to the laser diode LD is controlled according to the amount of light detected by the photo diode PD.

More specifically, the laser beam emitted from the laser diode LD enters the photo diode PD where the incident laser beam is photoelectrically converted. Then, the resulting electric current is converted into a voltage by the current/voltage converting variable resistor 114, and input to the comparator 112 for comparison with a reference voltage from the reference voltage source 111. When the voltage reflecting the light amount of the laser diode LD is higher than the reference voltage, the comparator 112 outputs a low-level output, and when the voltage is lower than the reference voltage, the comparator 112 outputs a high-level output, to thereby carry out charging and discharging of the holding capacitor 115. When the sample hold signal goes low, the sample hold control circuit 113 is turned off to maintain the voltage level of the holding capacitor 115, and the driving current source 110 determines the amount of current, that is, the amount of light (laser power) for driving the laser diode LD according to the maintained voltage level.

FIG. 5 shows the arrangement of a laser scanner for a copying machine or a printer to which is applied the laser drive device shown in FIGS. 4A and 4B. In FIG. 5, reference numeral 201 designates an image data-processing unit in which is mounted the image processor LSI 101 appearing in FIG. 4A. Reference numeral 202 designates a laser driver unit in which are mounted the laser driver IC 102, the 5V output regulator 103, and the semiconductor laser section 104, all appearing in FIG. 4B.

Reference numeral 203 designates a collimator lens for causing a laser beam irradiated from the semiconductor laser section 104 to converge into parallel light. Reference numeral 204 designates a polygon mirror which is rotated by a motor, not shown, in a direction indicated by the arrow in FIG. 5, to thereby reflect the laser beam for scanning. Reference numeral 205 designates a photosensitive drum that receives the laser beam reflected from the polygon mirror 204 to form an electrostatic latent image on a surface thereof. In doing this, the photosensitive drum 205 is irradiated with the laser beam while being rotated in the direction indicated by the arrow. Reference numeral 206 designates an fθ lens which deflects the laser beam from the polygon mirror 204 such that the scanning speed of the laser beam on the photosensitive drum 205 is made uniform from the center to each end of the drum surface.

The photosensitive drum 205 has one end thereof formed with a reference mark 207 for use in image formation. A sensor 208 is provided to detect the reference mark 207 and deliver the image generation start signal to the interface controller 105 of the image data-processing unit 201 (see FIG. 4A). Further, a sensor 209 is disposed on an extension line from the main scanning line along which the laser beam performs exposure scanning of the photosensitive drum 205. Whenever detecting the laser beam, the sensor 209 delivers the main scanning synchronization signal to the interface controller 105 and the laser control signal generator 107 of the image data-processing unit 201 (see FIG. 4A).

FIG. 6A is a timing chart macroscopically showing the relationship between the image generation start signal, the main scanning synchronization signal, and the image request signal.

The image generation start signal and the main scanning synchronization signal are delivered as described above, whereas the image request signal is delivered as follows: The interface controller 105 of the image processor LSI 101 installed in the image data-processing unit 201 counts pulses of the main scanning synchronization signal with reference to the image generation start signal, and upon the lapse of a predetermined time period T1 after receiving the image generation start signal, the interface controller 105 delivers the image request signal to the external device. The external device starts counting pulses of the main scanning synchronization signal upon reception of the image request signal, and upon the lapse of a predetermined time period T2 after the start of the counting, starts outputting image data. During a time period (T3-T2) until a predetermined time period T3 elapses after the start of the counting of pulses of the synchronization signal, image data can be outputted, that is, a valid image is present on the photosensitive drum 205.

FIG. 6B is a timing chart microscopically showing the relationship between the main scanning synchronization signal, the image data, the APC signal, and the sample hold signal. Upon reception of the main scanning synchronization signal, the laser control signal generator 107 of the image processor LSI 101 appearing in FIG. 4A delivers to the laser driver IC 102 the APC signal for specifying the light amount control period and the sample hold signal for specifying the time period over which the feedback loop for the light amount control is formed.

In the above case, as shown in FIG. 6B, the laser control signal generator 107 provides control such that when a predetermined time period T5 has elapsed after a fall of the immediately preceding pulse of the main scanning synchronization signal, the following pulse of the APC signal is caused to rise, and when a predetermined time period T6 has elapsed after a fall of the following pulse of the main scanning synchronization signal, the following pulse of the APC signal is caused to fall.

Further, the laser control signal generator 107 provides control such that each pulse of the sample hold signal occurs and lasts within the duration of a corresponding pulse of the APC signal. This prevents the sample hold signal from becoming enabled to form the feedback loop when the APC signal is in a disabled state and the laser diode LD is extinguished, since such feedback loop formation can result in excessive charging of the holding capacitor 115 and hence the amount of current to be supplied to the laser diode LD from the driving current source 110 being set to an excessively large value, causing breakage of the laser diode LD.

The external device starts outputting image data in an amount corresponding to one main scanning line when a predetermined time period T4 has elapsed with reference to the main scanning synchronization signal. This image data is converted by the pulse generator 106 of the image processor LSI 101 into a pulse signal (PWM signal: pulse width modulation signal) for causing the laser diode LD to emit light, and then is outputted to the laser driver IC 102. The laser driver IC 102 drivingly controls the laser diode LD based on the PWM signal from the pulse generator 106, to thereby form an electrostatic latent image using a laser beam modulated based on the image data.

However, the above-described laser drive device necessitates provision of the laser driver IC 102 in addition to the image processor LSI 101, and also the regulator 103 for supplying the 5V power to the laser driver IC 102, which increases the cost of the laser drive device.

SUMMARY OF THE INVENTION

It is a first object of the present invention to provide an inexpensive laser drive device which is capable of driving a laser for emission of an appropriate amount of light.

It is a second object of the present invention to provide an image forming apparatus including an inexpensive laser drive device which is capable of driving a laser for emission of an appropriate amount of light.

To attain the first object, in a first aspect of the present invention, there is provided a laser drive device comprising an integrated circuit having formed therein a generator device that generates a pulse width modulation signal based on image data, and a supply current control device, the integrated circuit having plural ports, and a plurality of resistors externally attached to respective ones of said ports, wherein the supply current control device is capable of supplying a driving current to a laser beam-emitting device via the ports and the resistors, and the supply current control device includes a plurality of switching devices which are attached to respective ones of said ports, and a signal output device that outputs signals to respective ones of the switching devices, to switch selectively said switching devices.

Preferably, resistance values of the resistors are set to values obtained by multiplication by respective multiples using a predetermined factor.

Preferably, the signal output device has a counter that performs a counting operation based on a predetermined clock signal, and the counter outputs bit signals corresponding to a count value of the counter such that the bit signals are distributed to the switching devices.

More preferably, the laser drive device comprises a detection device disposed outside the integrated circuit, for detecting an amount of light emitted from the laser beam-emitting device, and the counter performs a count-up operation and a count-down operation based on the predetermined clock signal according to an increase and a decrease in the amount of light detected by the detection device.

Preferably, the integrated circuit has at least one second predetermined port, the second predetermined port having externally attached thereto at least one second resistor, through which an offset current is caused to flow.

More preferably, the supply current control device comprises at least one second switching device that turns on and off at least one offset current to be supplied to the laser beam-emitting device via the second predetermined port and the second resistor, and the signal output device of the supply current control device outputs a control signal for turning on and off the offset current to the second switching device.

Further preferably, the laser drive device comprises a counter that performs a counting operation based on a predetermined clock signal, and the signal output device outputs bit signals corresponding to a count value of the counter such that the bit signals are distributed to the switching devices, the signal output device comprising at least one determination device that determines based on the bit signals from the counter whether or not to turn on or off the offset current.

Preferably, the ports of the integrated circuit further comprise a plurality of second predetermined ports, the laser drive device comprises a plurality of second resistors externally attached to the plurality of second predetermined ports, the supply current control device comprises a plurality of second switching devices that turn on and off a plurality of offset currents capable of being supplied to the laser beam-emitting device via the second predetermined ports and the second resistors, and the signal output device outputs a plurality of control signals for turning on and off the offset currents to the second switching devices.

More preferably, the signal output device has a counter that performs a counting operation based on a predetermined clock signal, and the counter outputs bit signals corresponding to a count value of the counter such that the bit signals are distributed to the switching devices, the signal output device comprising a plurality of determination devices that determine based on the bit signals from the counter whether or not to turn on or off the offset currents capable of being supplied from the supply current control device to the laser beam-emitting device via the second predetermined ports and the second resistors.

Further preferably, the offset currents capable of being supplied from the supply current control device to the laser beam-emitting device via the second predetermined ports and the second resistors have predetermined level differences therebetween.

Further preferably, the predetermined level differences are set according to a light amount characteristic of the laser beam-emitting device.

With the arrangement of the laser drive device according to the first aspect of the present invention, the driving current to be supplied to the laser beam-emitting device via the plurality of resistors which are externally attached to the I/O ports of the integrated circuit having the pulse signal generator formed therein for laser driving is variably controlled by turning on and off the driving current, using the plurality of switching devices. This makes it possible to provide an inexpensive laser drive device which is capable of driving the laser for emission of an appropriate amount of light.

To attain the second object, in a second aspect of the present invention, there is provided an image forming apparatus comprising a laser drive device, a laser beam-emitting device that emits a laser beam based on image data by the laser drive device, and an image forming device that forms images using the laser beam emitted from the laser beam-emitting device, wherein the laser drive device comprises an integrated circuit having formed therein a generator device that generates a pulse width modulation signal based on image data, and a supply current control device, the integrated circuit having plural ports, and a plurality of resistors externally attached to respective ones of the ports, wherein the supply current control device is capable of supplying a driving current to a laser beam-emitting device via the ports and the resistors, and the supply current control device includes a plurality of switching devices which are attached to respective ones of the ports, and a signal output device that outputs signals to respective ones of the switching devices, to switch selectively the switching devices.

The above and other objects, features, and advantages of the invention will become more apparent from the following detailed description taken in conjunction with the accompanying drawings.

BRIEF DESCRIPTION OF THE DRAWINGS

FIGS. 4A and 4B are block diagrams schematically showing the arrangement of a conventional laser drive device;

FIG. 6A is a timing chart showing various control signals for laser driving used in the conventional laser drive device and the laser drive device according to the embodiment of the present invention; and FIG. 6B is a timing chart showing a part of the FIG. 6A timing chart, together with other control signals for laser driving, on an enlarged scale.

DETAILED DESCRIPTION OF THE PREFERRED EMBODIMENTS

The present invention will now be described in detail below with reference to the drawings showing a preferred embodiment thereof.

Figure 1A:
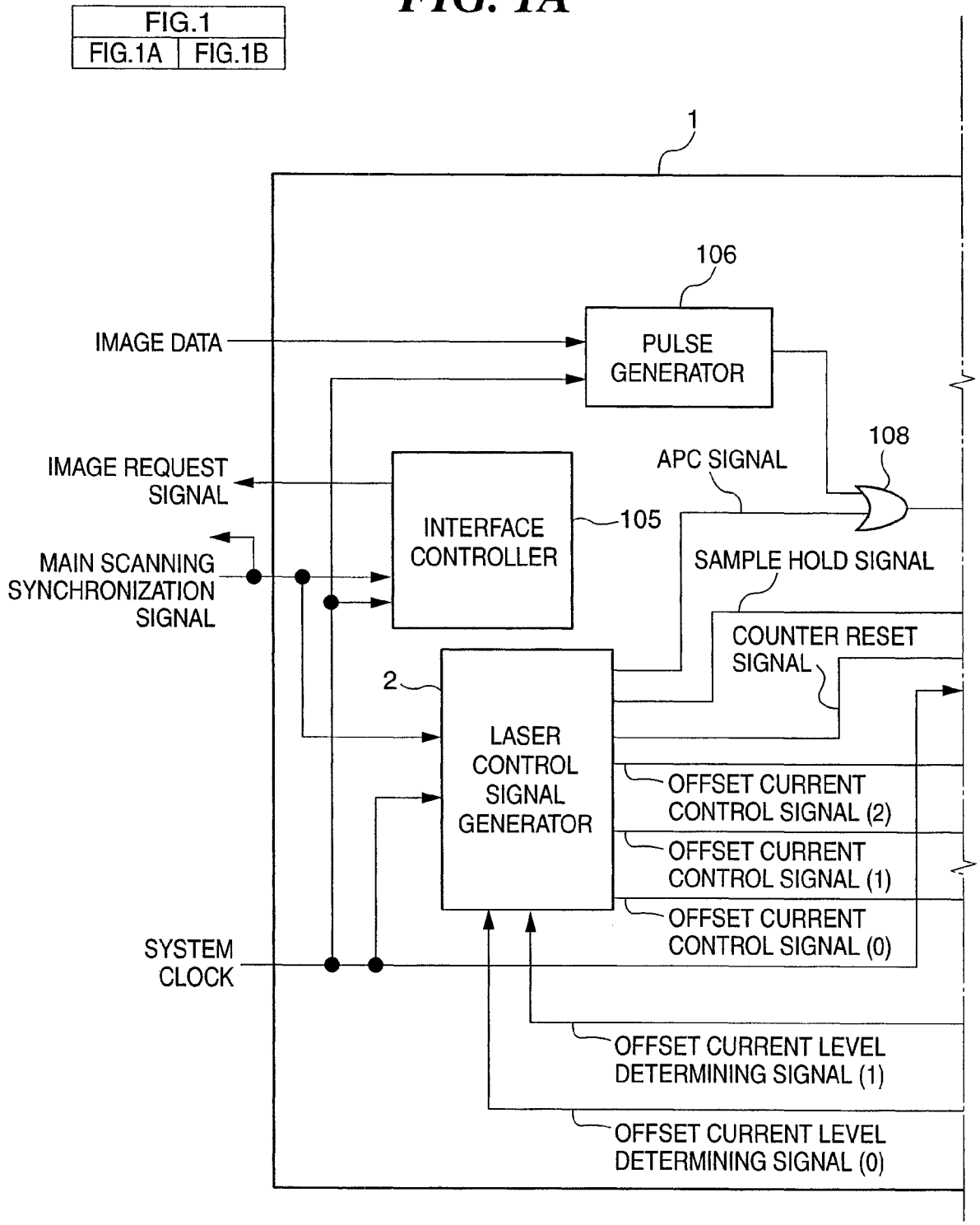
FIGS. 1A and 1B are block diagrams schematically showing the arrangement of a laser drive device according to an embodiment of the present invention.
Figure 1B:
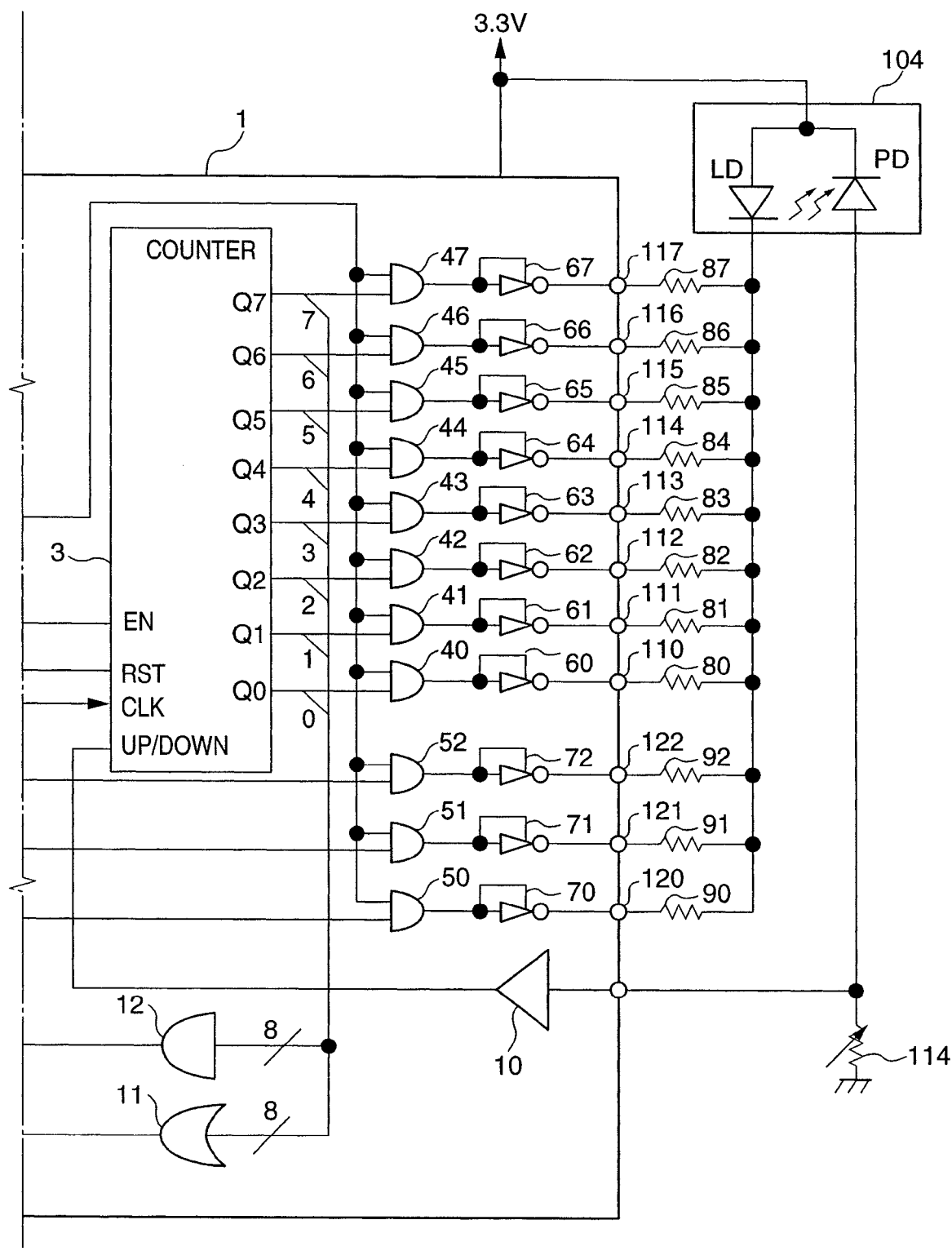
Figure 4B:
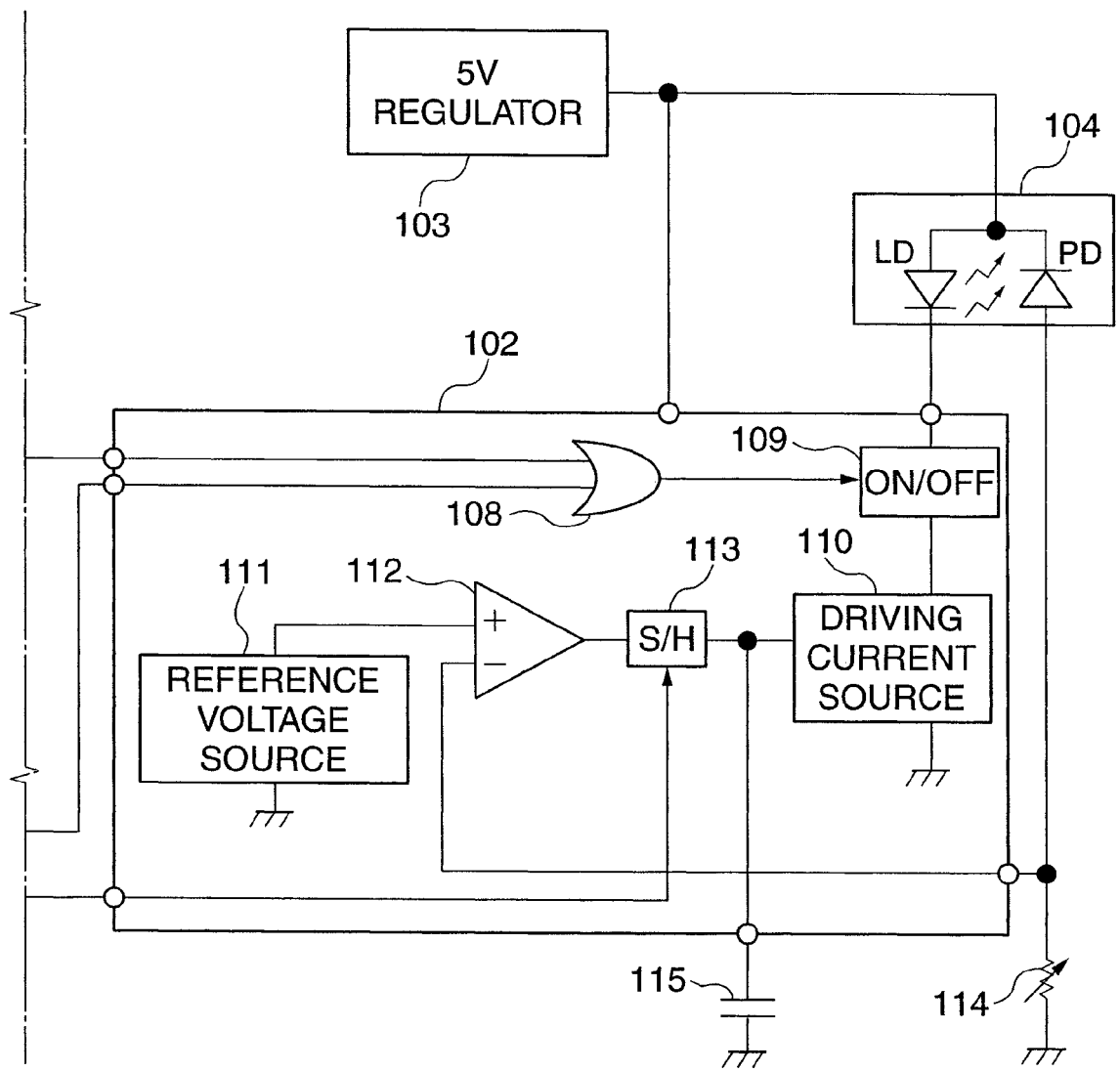

FIGS. 1A and 1B are block diagrams schematically showing the arrangement of a laser drive device according an embodiment of the present invention. Component elements identical to those of the conventional laser drive device shown in FIGS. 4A and 4B are designated by identical reference numerals, and description thereof is omitted.

In FIGS. 1A and 1B, reference numeral 1 designates an image processor LSI with a built-in laser driver circuit, which is basically constructed by incorporating a digital circuit for performing operations equivalent to those of the laser driver IC 102 of the conventional laser drive device, in the conventional image processor LSI 101. The LSI 1 includes first predetermined ports 110 to 117 and second predetermined ports 120 to 122.

In FIG. 1A, reference numeral 2 designates a laser control signal generator that outputs an APC signal and a sample hold signal, similarly to the laser control signal generator 107 of the conventional laser drive device in FIG. 4A. The laser control signal generator 2 further outputs an offset current control signal (0), an offset current control signal (1), and an offset current control signal (2), which are used for control of an offset current to be supplied to a laser diode LD, and outputs a counter reset signal.

Reference numeral 3 designates a counter which performs a count-up operation whenever a system clock pulse rises, when the sample hold signal is at a high level and an input signal to an UP/DOWN input terminal thereof is at a low level. On the other hand, when the sample hold signal is at a high level and the input signal to the UP/DOWN input terminal is at a high level, the counter 3 performs a count-down operation whenever the system clock pulse rises. Output bit terminals Q7 to Q0 are assigned, respectively, to MSB to LSB of a counter value of the counter 3. That is, in the present embodiment, the counter 3 outputs an 8-bit signal, and as described hereinafter, the counter value of the counter 3 is used to adjust a driving current for the laser diode LD.

Reference numerals 40 to 47 and 50 to 52 designate 2-input AND gates, all of which have one input terminal thereof connected to an output terminal of an OR gate 108. The other input terminals of the 2-input AND gates 40 to 47 are connected to the output bit terminals Q0 to Q7 of the counter 3, respectively, and the offset current control signals (0), (1), and (2) are input to the other input terminals of the 2-input AND gates 50 to 52, respectively. It should be noted that the offset current control signals (0), (1), and (2) define offset currents (0), (1), and (2) to be supplied to the laser diode LD (see FIG. 2).

Reference numerals 60 to 67 and 70 to 72 designate tri-state inverting buffers which have input terminals thereof connected to the output terminals of the respective associated 2-input AND gates 40 to 47 and 50 to 52, and output terminals thereof connected to the respective associated plurality of ports 110 to 117 and 120 to 122 of the image processor LSI 1. When input signals to the tri-state inverting buffers 60 to 67 and 70 to 72 go high, gates thereof are turned on to place the buffers into loaded states in which the high-level input signals are inverted into low-level signals that are delivered to the associated ports of the LSI 1, whereas when the input signals thereto go low, the gates thereof are turned off to place the associated ports into floating states.

Reference numerals 80 to 87 and 90 to 92 designate resistors which have one ends thereof connected to the respective associated ports 110 to 117 and 120 to 122, to which the tri-state inverting buffers 60 to 67 and 70 to 72 are connected, and all the other ends thereof connected to a cathode of the laser diode LD. The respective resistance values of the resistors 86 to 80 are set to values weighted by multiplying the resistance value of the resistor 87 by 2, 4, 8, 16, 32, 64, and 128, respectively, using a weighting factor of 2.

With the above arrangement and setting, respective currents flowing to the resistors 80 to 87 when the tri-state inverting buffers 60 to 67 are in their loaded states are weighed such that a laser driving current (i.e. an amount of light) can be set to a selected one of 256 levels varying from "0×I" to "255×I" according to the output value of the counter 3 using a current I flowing to the resistor 80 as a minimum resolution. More specifically, the resistors 80 to 87 variably set the laser driving current, and as stated above, are externally attached to the first predetermined ports 110 to 117 of the image processor LSI 1.

The resistors 90 to 92 (second resistors) set the offset amount of the laser driving current. The offset amount is set by at least one of the offset current control signals (0), (1), and (2) being loaded into at least corresponding one of the resistors 90 to 92.

Reference numeral 10 designates a buffer to which is input a voltage converted from a current supplied from the photodiode PD and reflecting the amount of light emitted from the laser diode LD using the current/voltage converting variable resistor 114. The buffer 10 has an input threshold of 1.65 V, which is at a level of half of a power supply voltage of 3.3 V. When the input voltage is higher than the input threshold, the buffer 10 delivers a high-level signal to the UP/DOWN input terminal of the counter 3, whereas when the input voltage is lower than the input threshold, the buffer 10 delivers a low-level signal to the UP/DOWN input terminal of the counter 3. In short, the buffer 10 serves as a comparator for comparing the amount of light emitted from the laser diode LD with the threshold.

In the present embodiment, the counter 3 performs the count-up operation when the input signal to the UP/DOWN input terminal is at a low level, whereas when the input signal input to the UP/DOWN input terminal is at a high level, it performs the count-down operation. Accordingly, when the laser diode LD has too high a light emission intensity, the driving current for driving the laser diode LD is reduced, whereas when the laser diode LD has too low a light emission intensity, the driving current for driving the laser diode LD is increased. In the image processor LSI 1, the timing and time period in and over which image data is captured from an external device, and the timing and time period in and over which the light amount control is performed are the same as those in the conventional image processor LSI 101.

An 8-bit Q output from the counter 3 is input to both an 8-input OR gate 11 and an 8-input AND gate 12. The 8-input OR gate 11 delivers its output to the laser control signal generator 2 as an offset current level determining signal (0), and the 8-input AND gate 12 delivers its output to the laser control signal generator 2 as an offset current level determining signal (1). In other words, the 8-input OR gate 11 and the 8-input AND gate 12 have the function of determining how the offset current should be set. As described hereinafter, the OR gate 11 determines whether or not conditions for decreasing the offset current are satisfied, and the AND gate 12 determines whether or not conditions for increasing the offset current are satisfied.

The laser control signal generator 2 varies the levels of the predetermined offset current control signals (0), (1), and (2) based on the offset current level determining signal (0) from the 8-input OR gate 11 and the offset current level determining signal (1) from the 8-input AND gate 12, to thereby vary the level of the offset current in at least three stages. Further, the laser control signal generator 2 delivers a counter reset signal to the counter 3 based on the offset current level determining signal (1) from the 8-input AND gate 12 to thereby clear the count value of the counter 3 to zero.

With the above arrangement, the light amount control is carried out during a time period over which the APC signal is at a high level (the light amount control period), to thereby determine an appropriate amount of light to be emitted from the laser diode LD. The offset current control signals (0), (1), and (2), and the counter value of the counter 3, with which the appropriate amount of light has been determined, are fixed until a new appropriate light amount is determined during the next light amount control period.

Then, when the PWM signal generated based on image data is at a high level, a current or currents from one or more of the resistors 80 to 87, associated with high-level one or more of the Q outputs (Q0 to Q7) of the counter 3, and a current or currents from one or more of the resistors 90 to 92, associated with high-level one or more of the offset current control signals (0), (1), and (2) are superimposed on each other, to be supplied to the laser diode LD, whereby a laser beam (image light) having an appropriate amount of light forms an electrostatic latent image on the photosensitive drum.

Next, a description will be given of the outline of a method of setting the laser driving current in the present embodiment, with reference to FIG. 2.

Figure 2:
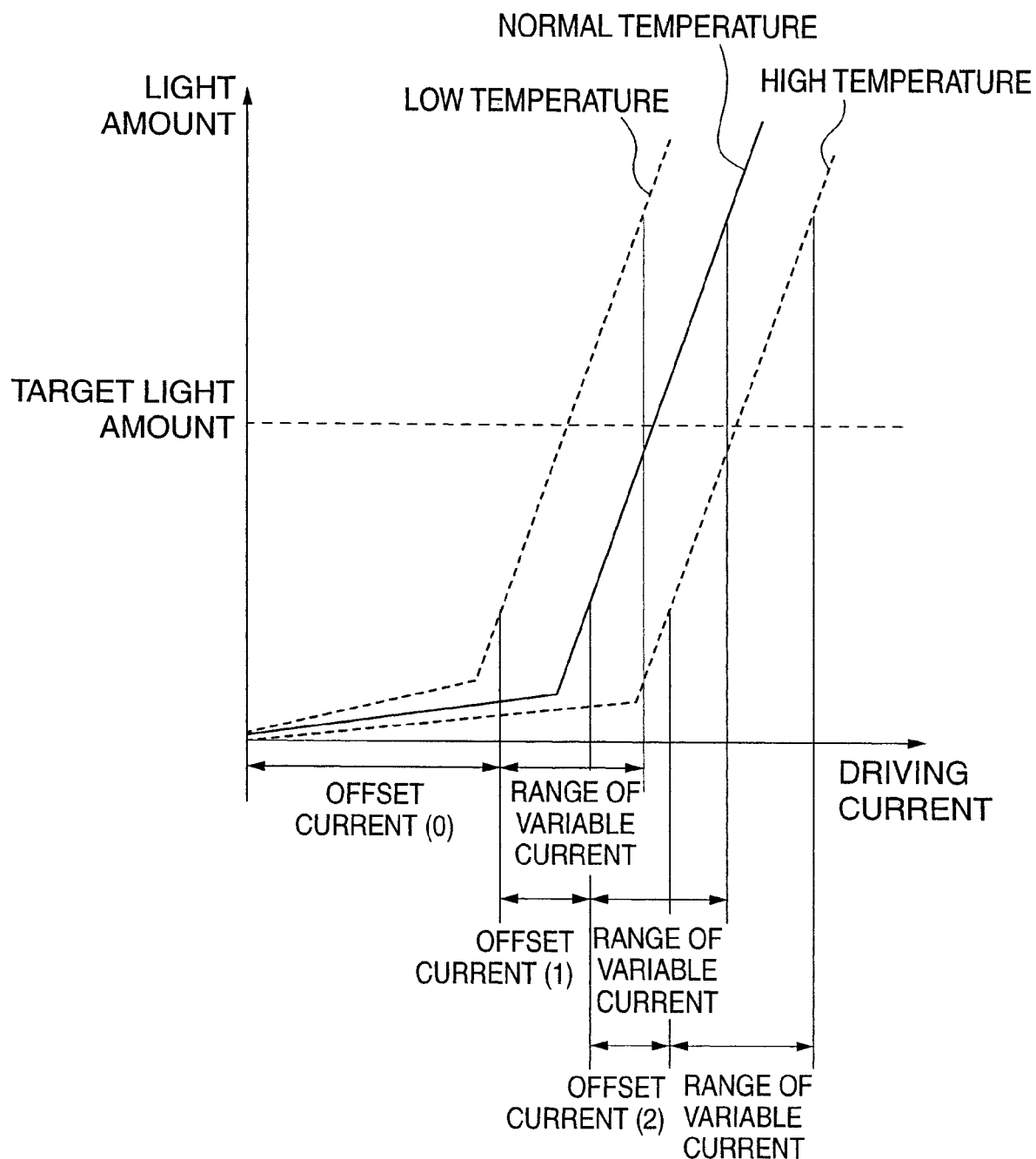
FIG. 2 is a graph useful in explaining the outline of a method of setting a laser driving current.

The offset currents (0), (1), and (2) shown in FIG. 2 are caused to flow to the resistors 90 to 92 according to the offset current control signals (0), (1), and (2), respectively.

The laser diode LD to be controlled by the laser drive device has a driving current vs light amount characteristic, as illustrated in FIG. 2, by way of example. Further, the characteristic is temperature-dependent. More specifically, in a smaller driving current region, the amount of light emitted from the laser diode LD increases at a smaller rate of increase with an increase in the driving current, whereas in a large driving current region, the amount of light increases at a large rate of increase with an increase in the driving current. Further, the amount of light decreases with a rise in ambient temperature.

When the laser diode LD to be controlled is under a normal temperature environment, i.e. when the laser diode LD exhibits a light amount characteristic indicated by the solid line in FIG. 2, the offset current control signal (0) and the offset current control signal (1) are caused to go high such that the offset currents (0) and (1) are caused to flow to the resistors 90 and 91 when the APC signal or a pulse signal supplied to the OR gate 108 is at a high level. Current(s) flowing to any selected one or more of the resistors 80 to 87, corresponding to one or more of the output bits of the counter 3 which has or have been caused to go high through the light amount control, are superimposed on the above offset currents (0) and (1), whereby a target light amount (appropriate amount of light) is set.

In this state, when the ambient temperature changes, the light amount characteristic of the laser diode LD shifts leftward or rightward from the characteristic indicated by the solid line, as viewed in FIG. 2. In such a case, the above-described settings, in which the offset currents (0) and (1) are caused to flow to the resistors 90 and 91 and which are suitable for normal temperature, are changed e.g. by subtracting the offset current (1) from the offset currents (0) and (1), or adding the offset current (2) to the offset currents (0) and (1), thereby making it possible to cope with changes in the environment, particularly changes in the ambient temperature. Further, the driving current is changed according to the bit outputs from the counter 3, which enables the settings of the driving current to be changed in a fine manner according to changes in the environment.

Next, a detailed description will be given of the method of setting the laser driving current according to changes in the ambient temperature, with reference to a timing chart appearing in FIG. 3. It should be noted that offset light amounts (0) and (1) appearing in FIG. 3 are the respective amounts of light emitted from the laser diode LD, which correspond to the offset currents (0) and (1) caused to flow to the resistors 90 and 91 according to the offset current control signals (0) and (1), respectively.

Figure 3:
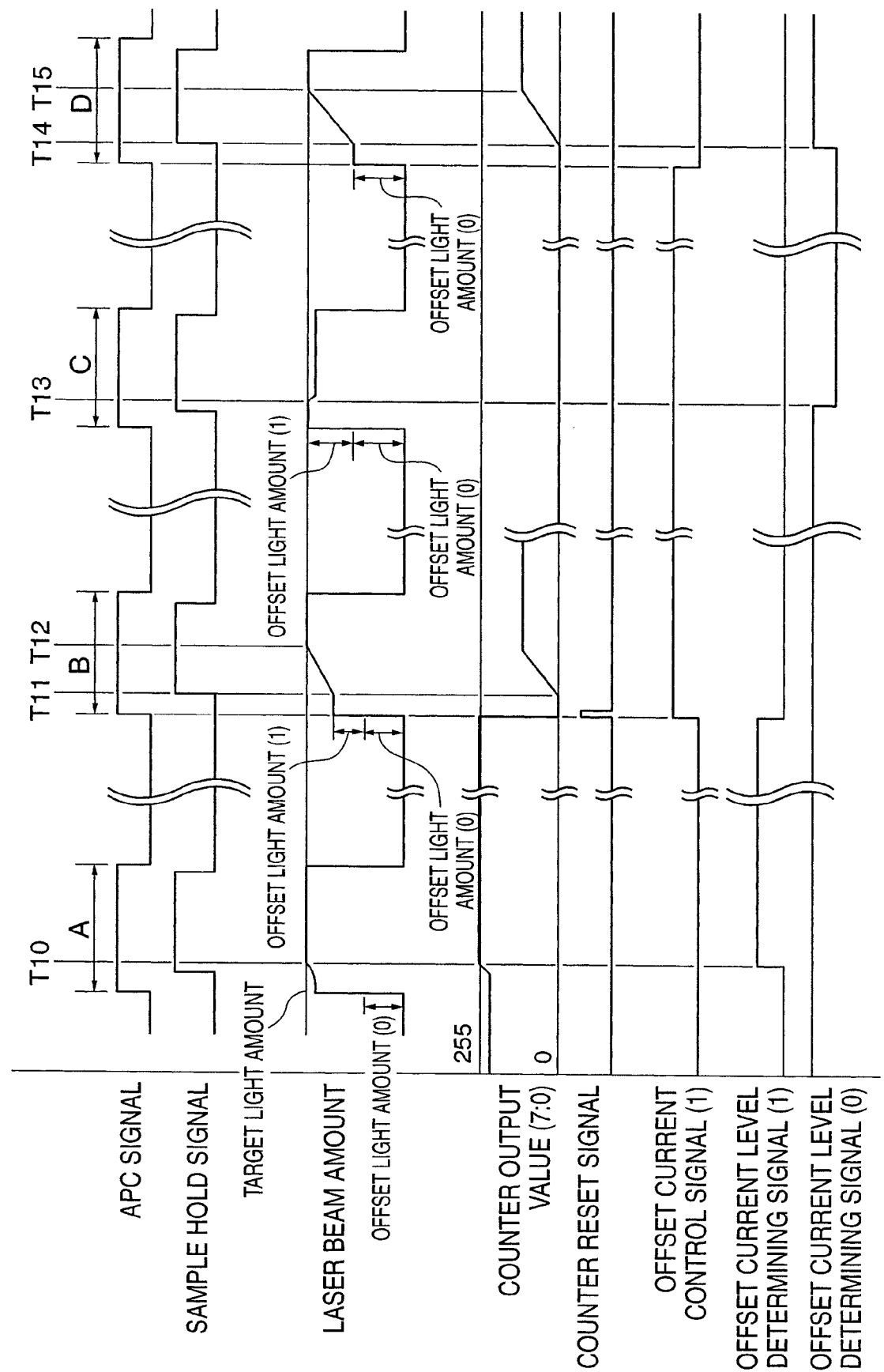
FIG. 3 is a timing chart useful in explaining details of the method of setting the laser driving current.

Now, let it be assumed that during a light amount control period prior to a light amount control period A in FIG. 3, the target light amount could be maintained by the sum of the offset light amount (0) determined by the high-level offset current control signal (0) and the amount of light determined by a variable current dependent on the bit outputs from the counter 3.

In this state, when the ambient temperature rises, as shown in FIG. 2, the amount of light emitted from the laser diode LD decreases, and hence it becomes no longer possible to maintain the target light amount. Therefore, to maintain the target light amount, the count-up operation is performed by the counter 3 to progressively increase the variable current. Now, let it be assumed that a state occurs in which the target light amount is barely maintained by the output value of the counter 3 reaching its maximum value of "255", as during the light amount control period A.

During the light amount control period A, when the output value of the counter 3 becomes equal to its maximum value "255" (time T10), the 8-input AND gate 12 switches the offset current level determining signal (1) as its output signal, to a high level. When the offset current level determining signal (1) goes high, then, upon a rise of the following APC signal (light amount control period B), the laser control signal generator 2 delivers the counter reset signal to reset the count value of the counter 3 to "0" and at the same time switches the offset current control signal (1) to a high level.

This causes the count value of the counter 3 to be sequentially incremented from "0" after a rise of the sample hold signal at time T11, and then the amount of light corresponding to the variable current dependent on the bit outputs from the counter 3 is added to the sum of the offset light amounts (1) and (0) associated with the high-level offset current control signals (1) and (0), whereby the light amount of the laser beam reaches the target light amount (time T12).

When the ambient temperature lowers from the state during the light amount control period B, as shown in FIG. 2, the amount of light emitted from the laser diode LD increases, which eventually makes it no longer possible to maintain the target light amount. Therefore, to maintain the target light amount, the count-down operation is performed by the counter 3 to progressively decrease the variable current. Now, let it be assumed that a state occurs in which the target light amount can be barely maintained by the output value of the counter 3 becoming equal to its minimum value of "0", as during a light amount control period C.

During the light amount control period C, when the output value of the counter 3 becomes equal to its minimum value "0", the 8-input OR gate 11 switches the offset current level determining signal (0) as its output signal, to a low level (time T13). When the offset current level determining signal (0) goes low, then, upon a rise of the following pulse of the APC signal (light amount control period D), the laser control signal generator 2 switches the offset current signal (1) to a low level.

This causes the count value of the counter 3 to be sequentially incremented from "0" after a rise of a pulse of the sample hold signal at time T14, and the amount of light associated with the variable current dependent on the bit outputs from the counter 3 is added to the offset light amount (0) associated with the high-level offset current control signal (0), whereby the light amount of the laser beam comes to reach the target light amount (time T15).

As described above, the offset current having been set for the normal temperature so as to realize the target light amount and the count value of the counter 3 are changed according to a change in the ambient temperature, whereby even if the ambient temperature changes, it is possible to maintain the target light amount. It should be noted that it is also possible to maintain the target light amount by adding the offset current (2) to the offset currents (0) and (1) as required in a state where the offset currents (0) and (1) have been set.

More specifically, when the output value of the counter 3 reaches its maximum value in a state in which the offset current control signals (0) and (1) are at a high level, the offset current level determining signal (1) as the output signal from the 8-input AND gate 12 goes high, and in response thereto the laser control signal generator 2 switches the offset current control signal (2) to a high level. In this state of the setting of the offset current, when the output value of the counter 3 has reached its minimum value, the offset current level determining signal (1) goes low, and in response thereto the offset current control signal (2) is switched to a low level.

As described hereinbefore, according to the present embodiment, the functions of the conventional laser driver IC are realized on the image processor LSI by the digitally constructed equivalent circuit, and a desired driving current is supplied to the laser using the plurality of ports of the image processor LSI. This can dispense with provision of the laser driver IC and a regulator for supplying the power to the laser driver IC separately from the image processor LSI, thereby making it possible to realize an inexpensive laser drive device.

Figure 5:
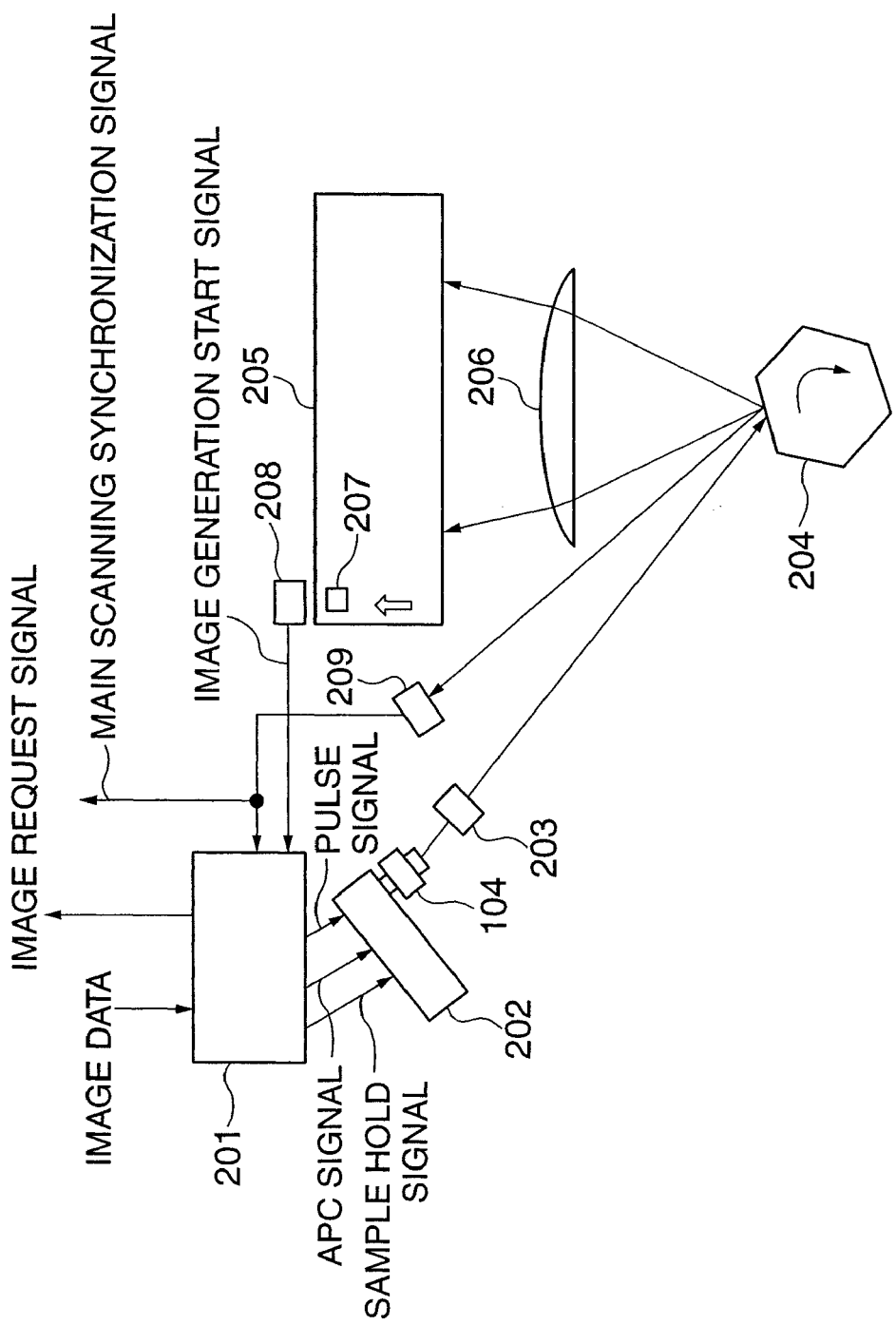
FIG. 5 is a block diagram schematically showing the arrangement of a conventional laser scanner.

Further, the laser drive device according to the present embodiment can be applied to an image forming apparatus including a laser beam-emitting device that emits a laser beam by being driven by a driving current modulated based on image data by the laser drive device, and an image forming device that forms images using the laser beam emitted from the laser beam-emitting device. For example, the laser drive device can be installed in a copying machine or a printer equipped with a laser scanner as shown in FIG. 5. In this case, as is different from the laser scanner shown in FIG. 5, the laser scanner is equipped with the LSI 1 shown in FIGS. 1A and 1B and having the externally attached resistors 80 to 87 and 90 to 92, in place of the image data-processing unit 201 and the laser driver unit 202.

While the present invention has been described heretofore, the present invention is by no means limited to the above-described embodiment, but various modifications and alterations can be made thereto.

For example, although in the above-described embodiment, the counter 3 for delivering the 8-bit signal is used, and eight resistors are provided for variably adjusting the laser driving current, this is not limitative, but the bit number of the signal output from the counter 3 and the number of resistors to be provided for variably adjusting the driving current can be selected as required according to a range of adjustment necessitated for variably adjusting the driving current and the minimum resolution.

Further, although in the above-described embodiment, three resistors for adjusting the offset current, and three switching devices associated therewith are provided in addition to the resistors for variably adjusting the driving current, and the switching devices (tri-state inverting buffers) associated therewith, the respective numbers of the resistors to be provided for adjusting the offset current and the switching devices therefor are by no means limited to three, but they can be selected as required according to the driving current vs light amount characteristic of the laser diode LD and the environment of use of the diode. It is not essential to form the switching devices associated with the resistors for adjusting the offset current within the integrated circuit (LSI). For example, the laser drive device may be configured such that a resistor for adjusting the offset current is externally attached to a port of the integrated circuit, and the port is connected to the output terminal of the OR gate 108 for outputting the logical sum of the PWM signal and the APC signal, to thereby superimpose a constant offset current on the driving current. It should be noted that it is not essential to superimpose the offset current on the driving current, depending on the characteristics of the laser diode and the environment of use thereof. In this case, it is possible to dispense with the resistor for adjusting the offset current.

Further, although in the above-described embodiment, the offset current level determining signal (1) is switched to a high level when the output value of the counter 3 has reached its maximum value, this is not limitative, but the above switching operation may be performed when the output value of the counter 3 has reached a predetermined value. Similarly, it is not essential to switch the offset current level determining signal (0) to a low level when the output value of the counter 3 has reached its minimum value, but the above switching operation may be performed when the output value of the counter 3 has reached a second predetermined value.

CROSS REFERENCE TO RELATED APPLICATION

This application claims priority from Japanese Patent Application No. 2004-299073 filed Oct. 13, 2004, which is hereby incorporated by reference herein.

What is claimed is:

1. A laser drive device that controls an amount of light emitted from a laser beam-emitting device that emits a laser beam based on image data, comprising:
    a detecting device that detects the amount of light emitted from the laser-beam emitting device;
    an integrated circuit having a generator device adapted to generate a modulation signal based on the image data, a current control device adapted to control a driving current supplied to the laser beam-emitting device, a first group of ports connected to the current device, and a second group of ports different from the first group of ports; and
    a first group of resistors, different in resistance value from one another, connected to the first group of ports of the integrated circuit, respectively,
    wherein the current control device is adapted to supply the driving current to the laser beam-emitting device any of the first group of ports based on the detection results of the detection device, and
    wherein the current control device is adapted to supply the driving current to the laser beam-emitting device via any one of the second group of ports in response to a temperature around the laser beam-emitting device.

2. A laser drive device as claimed in claim 1, wherein the resistance values of the first group of resistors are set based on predetermined weighting factors, respectively.

3. A laser drive device as claimed in claim 1, wherein the current control device includes a plurality of switching devices connected to respective ones of the first group of ports, and a signal output device adapted to output signals of selectively driving the switching devices, and the current control device is adapted to select any of the first group of ports.

4. A laser drive device as claimed in claim 3, wherein the current control device includes a counter that performs a counting operation based on a predetermined clock signal, and the signal output device is adapted to output bit signals corresponding to a count value of the counter.

5. A laser drive device as claimed in claim 4, wherein the counter is adapted to perform a count-up operation and a count-down operation based on the predetermined clock signal according to an increase and a decrease in the amount of light output from the detection device.

* * * * *